(12) United States Patent  (10) Patent No.: US 9,112,519 B1
Ye et al.  (45) Date of Patent: *Aug. 18, 2015

(54) APPARATUS AND METHODS OF RATE CONTROL FOR A SAMPLE RATE CONVERTER

(71) Applicant: ALTERA CORPORATION, San Jose, CA (US)

(72) Inventors: Zhuan Ye, Fremont, CA (US); Colman Cheung, San Diego, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/136,642

(22) Filed: Dec. 20, 2013

Related U.S. Application Data

(63) Continuation of application No. 13/524,473, filed on Jun. 15, 2012, now Pat. No. 8,648,738.

(51) Int. Cl.
H03M 7/00 (2006.01)

(52) U.S. Cl.
CPC ....................................... *H03M 7/00* (2013.01)

(58) Field of Classification Search
CPC .............. H03M 2201/4175; H03M 2201/162; H03M 2201/4155; H03M 2201/418; H03M 2201/4185; H03M 7/00
USPC ............................................. 341/61; 455/296
See application file for complete search history.

(56) References Cited

U.S. PATENT DOCUMENTS 7,809,346 B2 * 10/2010 Risbo et al. .................. 455/296
2010/0239054 A1 * 9/2010 Aoyagi ......................... 375/344

* cited by examiner

*Primary Examiner* — Jean B Jeanglaude
(74) *Attorney, Agent, or Firm* — Okamoto & Benedicto LLP

(57) ABSTRACT

One embodiment relates to an apparatus for sample rate conversion. A sample rate converter is arranged to receive an input signal at an input sampling frequency and use an interpolation interval to convert the input signal to an output signal at an output sampling frequency. A rate controller is arranged to alternate between different frequency control words for use in generating the interpolation interval signal. Another embodiment relates to a method of sample rate conversion. Another embodiment relates to a rate controller circuit. Other embodiments, aspects, and features are also disclosed.

20 Claims, 7 Drawing Sheets

APPARATUS AND METHODS OF RATE CONTROL FOR A SAMPLE RATE CONVERTER

CROSS-REFERENCE TO RELATED APPLICATION(S)

The present application is a continuation of U.S. patent application Ser. No. 13/524,473, filed Jun. 15, 2012, entitled "Apparatus and Methods of Rate Control for a Sample Rate Converter," the disclosure of which is hereby incorporated by reference.

BACKGROUND

1. Technical Field

The present invention relates to sample rate converters.

2. Description of the Background Art

A sample rate converter (SRC) is an electronic devices used for adapt or convert a rate at which a signal is sampled. In an ideal case, a signal x(t) sampled at frequency $f_{in}$ may be input into the SRC, and the same signal x(t) sampled at an output frequency $f_{out}$ may be output by the SRC.

In a fractional sample rate converter (FSRC), M samples may be received in a time interval T and N samples may be output in the same time interval T, where M and N are integers. The rate conversion may be referred to as up-sampling if N is greater than M and may be referred to as down-sampling if N is less than M.

SUMMARY

One embodiment relates to an apparatus for sample rate conversion. A sample rate converter is arranged to receive an input signal at an input sampling frequency and use an interpolation interval to convert the input signal to an output signal at an output sampling frequency. A rate controller is arranged to alternate between different frequency control words for use in generating the interpolation interval signal.

Another embodiment relates to a method of sample rate conversion. One of multiple frequency control words is selected depending on a control signal, and the selected frequency control word is used to generate an interpolation interval. The interpolation interval is used to convert an input signal having an input sampling rate to an output signal having an output sampling rate.

Another embodiment relates to a rate controller circuit. A counter is receives a clock signal having a clock frequency which corresponds to an output sampling frequency, and an enable signal is generated that indicates when the counter is at a first number modulo N. A comparator is arranged to compare an interpolation interval against a second number when the enable signal indicates that the counter is the first number modulo N and is further arranged to output a first value for the control signal if the interpolation interval is less than the second number and a second value for the control signal if the interpolation interval is greater than the second number. Finally, a selector is arranged to receive the control signal and select a first frequency control word when the control signal is the first value and a second frequency control word when the control signal is the second value.

Other embodiments, aspects, and features are also disclosed.

DETAILED DESCRIPTION

Disclosed herein are apparatus and methods of rate control for a sample rate converter. The apparatus and methods use a "bing-bang" control which is designed to maintain a precise sample frequency in a FSRC.

Advantageously, the technique disclosed herein provides a robust technique to achieve a precise output sampling frequency. The disclosed technique may be implemented using a relatively small amount of additional circuitry or digital signal processing (DSP) software. Minimal latency is introduced with the disclosed technique compared with a division-based technique.

Figure 1:
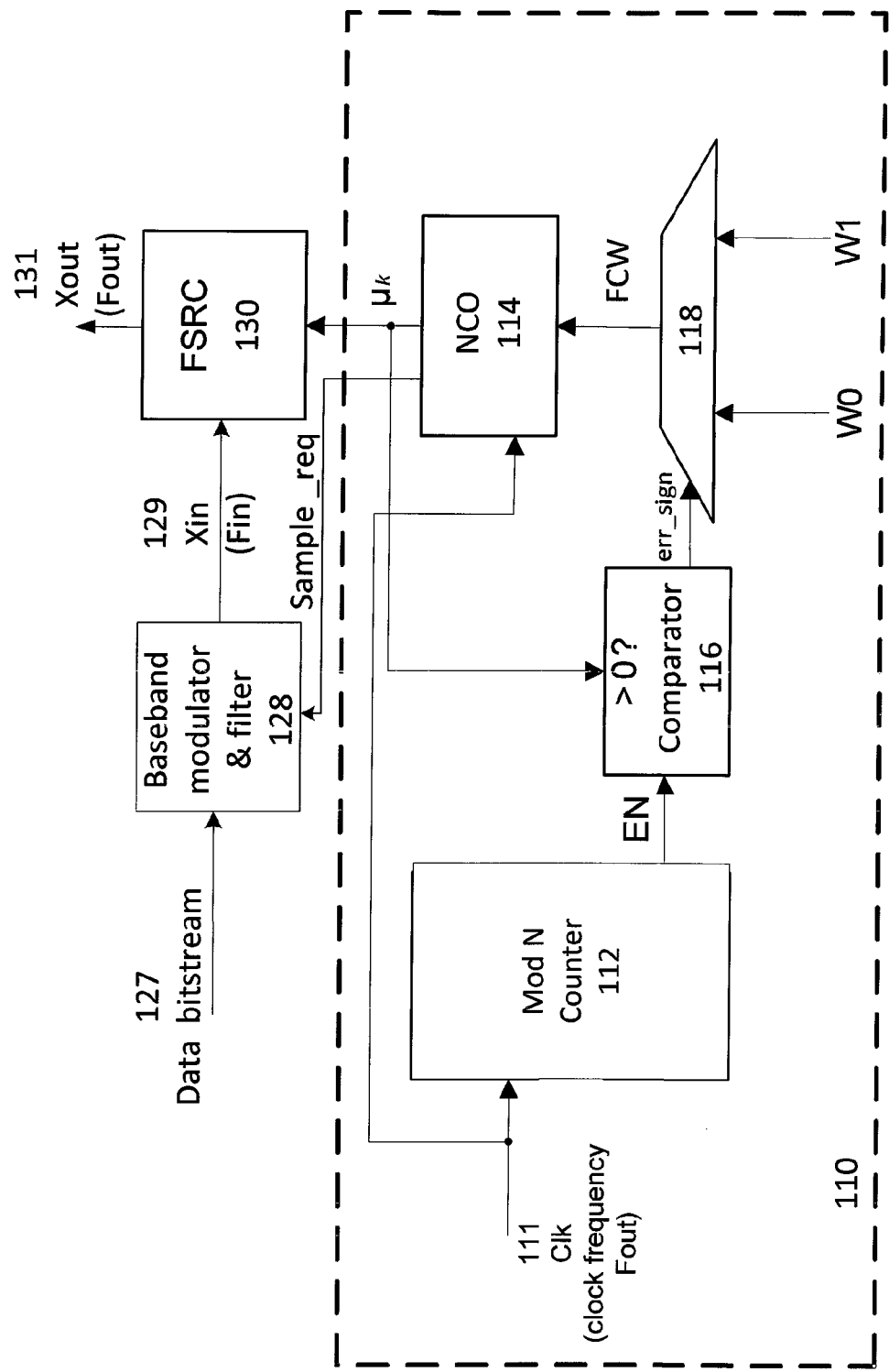
FIG. 1 depicts an exemplary rate control apparatus for a sample rate converter in accordance with an embodiment of the invention.

FIG. 1 depicts an exemplary rate control circuit 110 for a fractional sample rate converter (FSRC) 130 in accordance with an embodiment of the invention. As shown, a data bitstream 127 may be input into a baseband modulator and filter 128. The baseband modulator and filter 128 receives a sample request signal (sample_req) from a numerically controlled oscillator (NCO) 114 and generates an input signal Xin 129 with a sample rate of Fin.

As further shown, the FSRC 130 may receive the input signal Xin 129 from the baseband modulator and filter 128 and an interpolation interval $\mu_k$ from the rate control circuit 110. The FSRC 130 may generate an output signal Xout 131 with a sample rate of Fout. The FSRC 130 receives M samples in a same time period as it outputs N samples. The FSRC 130 may be implemented, for example, using a Farrow structure to perform polynomial-based interpolation.

In accordance with an embodiment of the invention, the rate control circuit 110 may include a modulo N counter (mod N counter) 112, the NCO 114, a comparator 116, and a word selector 118. The mod counter 112 and the NCO 114 may be arranged to receive the clock signal Clk 111 with a clock frequency Fout which corresponds or is equal to the sample rate Fout of the output signal Xout 131. The NCO 114 may be further arranged to receive an N-bit frequency control word (FCW) and output the interpolation interval $\mu_k$ to the FSRC 130. Mod N counter 112 counts the number of cycles in Clk and in doing so effectively counts the number of samples in Xout.

The modulo N counter 112 may be arranged to output an enable signal (EN) which indicates when the count is zero modulo N. In other words, the EN signal may indicate when the count is an integer multiple of N (i.e. 0, N, 2N, 3N, and so on). For example, EN may be high when the count is zero modulo N, and EN may be low otherwise.

The NCO 114 may include an accumulator which adds the N-bit FCW to an N-bit register value which is the accumulated value from previous clock cycles. In one implementation, the interpolation interval $\mu_k$ may be provided by, or generated from, the N-bit register value.

As described further below, in accordance with an embodiment of the invention, the FCW may be selected between two words W0 and W1. For some clock cycles, FCW may be selected to be W0, while for the remaining clock cycles FCW may be selected to be W1.

The comparator 116 may be arranged such that when it is enabled (as indicated by EN), it compares the interpolation interval $\mu_k$ against a fixed value. In accordance with an embodiment of the invention, the fixed value may be zero. For example, if the number of bits used for the interpolation interval is eight (K=8), then the fixed value may be 00000000. If $\mu_k$ is less than 00000000, then the comparator 116 may output a first value (for example, a logical low level or binary zero) for the control signal err_sign. On the other hand, if $\mu_k$ is equal to or greater than 00000000, then the comparator 116 may output a second value (for example, a logical high level or binary one) for the control signal err_sign. For example, consider an implementation where a positive number is indicated by the most significant bit of the interpolation interval $\mu_k$ being zero, and a negative number is indicated by the most significant bit of the interpolation interval being one. In such an implementation, $\mu_k$ is less than 00000000 for the values 11111111, 11111110, 11111101, 11111100, and so on, down to 10000000, and $\mu_k$ is greater than or equal to 00000000 for the values 00000000, 00000001, 00000010, 00000011, and so on, up to 01111111. In a practical system, K may be a larger number, such as 24 or more, for example.

When the comparator 116 is not enabled, then it may keep its same output state. In other words, the output of the comparator 116 may change state only when EN is high (enabled) and may maintain the same state as the preceding clock cycle when EN is low (not enabled).

The word selector 118 may be arranged to select a first word W0 for use as the FCW if it receives the first value of the control signal err_sign from the comparator 116 and select a second word W1 for use as the FCW if it receives the second value of the control signal err_sign from the comparator 116. The first word W0 represents a slightly faster rate for the output sampling frequency relative to the input sampling frequency, and the second word W1 represents a slightly slower rate for the output sampling frequency relative to the input sampling frequency. In accordance with an embodiment of the invention, the long-term average of the sampling frequency ratio Fin/Fout converges with precision to the desired value of M/N.

Figure 2:
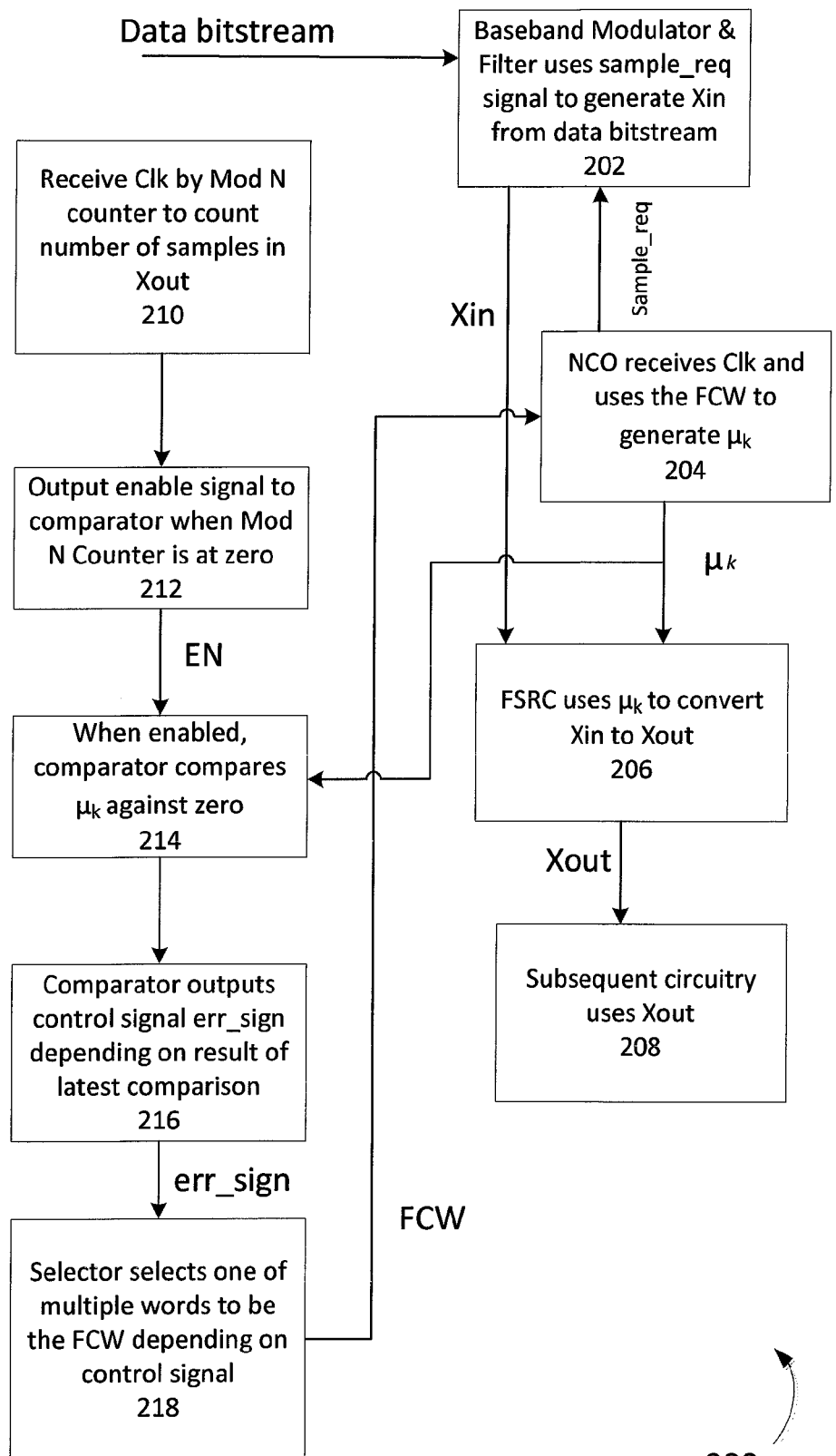
FIG. 2 is a flow chart showing an exemplary method of rate control for a sample rate converter in accordance with an embodiment of the invention.

FIG. 2 is a flow chart showing an exemplary method 200 of rate control for a sample rate converter in accordance with an embodiment of the invention. As shown, a data bitstream and a sample request (sample_req) signal may be received 202 by baseband modulator and filter circuitry 128, and the baseband modulator and filter 128 may use them to generate the input signal Xin 129 which is output to the FSRC 130. The sampling frequency Fin of the input signal Xin 129 is controlled by the sample_req signal.

The NCO 114 may use the FCW from the selector 118 to generate 204 the sample_req signal and the interpolation interval $\mu_k$. The FSRC 118 may use the interpolation interval $\mu_k$ to convert 206 the input signal Xin 130 (having sampling frequency Fin) to the output signal Xout 131 (having sampling frequency Fout). The ratio Fin/Fout is controlled by the interpolation interval $\mu_k$.

Subsequent circuitry may use 208 the output signal Xout 131. For example, the subsequent circuitry may use the output signal Xout 131 to generate an analog signal for transmission of data over a high-speed serial link.

As further shown, the clock signal Clk 111 having the clock frequency Fout may be received 210 by the mod N counter 112. The mod N counter 112 counts the number of cycles in Clk and in doing so effectively counts the number of samples in Xout. The modulo N counter 112 outputs 212 an enable signal to the comparator 116 when its count is at zero. When its count is not zero, the modulo N counter 112 does not output the enable signal.

During times when the enable signal is received by the comparator 116, the comparator 116 compares 214 the interpolation interval $\mu_k$ (which may be received from the NCO 114 via a feedback path) against zero. The comparator 116 may output 216 a control signal err_sign that depends on the latest comparison. During times when the enable signal is not received by the comparator 116, the control signal err_sign may remain unchanged from its previous state.

Depending on the state of the control signal err_sign, the selector 118 may select 218 one of multiple words to be the FCW. In an exemplary implementation, the selector 118 may select a first word W0 if err_sign is in a first state and may select a second word W1 if err_sign is in a second state. The selected FCW may be output by the selector 118 to the NCO 114, and the NCO 114 may use the selected FCW to generate the sample_req signal and the interpolation interval $\mu_k$ so to precisely control Fin and Fout as described above.

Figure 3:
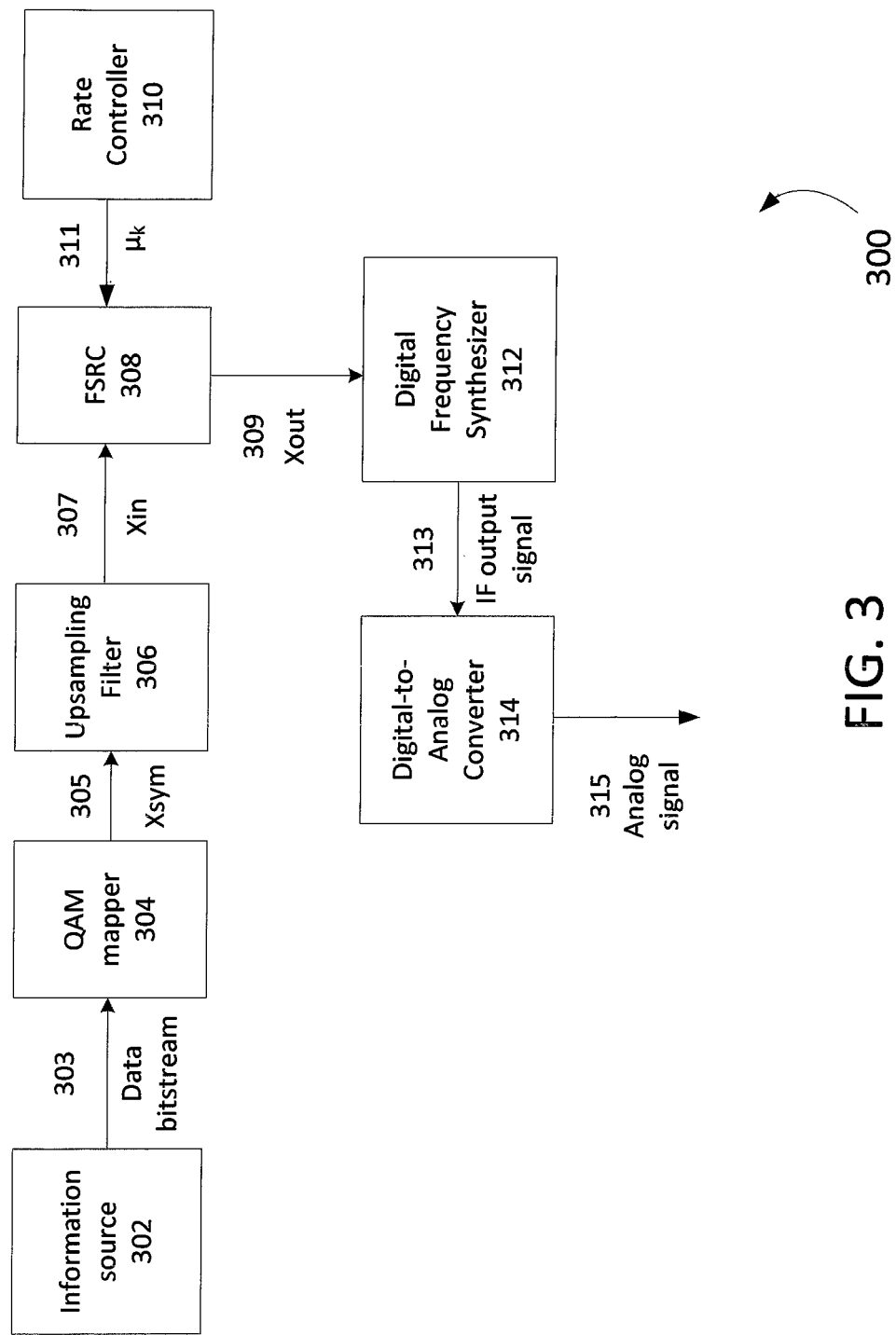
FIG. 3 depicts exemplary data transmission circuitry which may utilize the apparatus and methods of rate control for a sample rate converter in accordance with an embodiment of the invention.

FIG. 3 depicts exemplary data transmission circuitry 300 which may utilize the apparatus and methods of rate control for a sample rate converter in accordance with an embodiment of the invention. As shown, a data bitstream 303 may be provided from an information source 302 to a QAM (quadrature amplitude modulation) mapper 304.

The QAM mapper 304 may be arranged to map the data bitstream 303 into QAM symbols and generate a symbol signal Xsym 305 with a symbol rate of Fsym. The up-sampling filter 306 may be arranged to receive the symbol signal Xsym 305 from the QAM mapper 304 and generate an up-sampled signal Xin 307 having sampling frequency Fin.

The FSRC 308 may be arranged to receive the up-sampled signal Xin 307 with a sample rate of Fin and an interpolation interval $\mu_k$ 311 from the rate control circuit 310 and generate an output signal Xout 309 with a sample rate of Fout. The rate controller 310 may be arranged to receive a clock signal Clk with clock frequency Fout and output the interpolation interval $\mu_k$ 311 to the FSRC 308. As described above, the rate controller 310 may be arranged to switch between two FCWs for use in controlling an NCO in accordance with an embodiment of the invention.

The digital frequency synthesizer 312 may be arranged to translate the base-band output signal Xout 309 at the sample rate Fout to the desired intermediate frequency (IF) output signal 313 also at the sample rate Fout. In an exemplary implementation, the digital frequency synthesizer 312 may be a quadrature direct digital frequency synthesizer (QDDFS).

Finally, the IF output signal 313 may be converted to an analog signal 315 using a digital-to-analog converter (DAC) 314. The analog signal 315 may be driven onto a transmission medium for a high-speed serial link, for example.

Computer simulations have been performed to evaluate the frequency error and timing error for the rate control technique disclosed herein. In the simulation, Fout=16 megahertz (MHz), and Fin=2 Fsym, where Fsym=10.24 MHz×(78/149) as specified by the DOCSIS (data over cable service interface specifications) DRFI (downstream radio frequency interface) specification. In this example, the sampling frequency ratio=Fin/Fout=2496/3725=0.67006711. Hence, M=2496, and N=3725 such that the rate conversion satisfies the FSRC requirement of M and N being integers.

In the case where the number of bits used for the interpolation interval is twenty-four (K=24), the W0 value may be the 24-bit binary number for 11,241,860, and the W1 value may be the 24-bit binary number for 11,241,861. Here, the W0 value of 11,241,860 represents a sampling frequency ratio of $11,241,860/2^{24}=0.67006707$, and the W1 value of 11,241,861 represents a sampling frequency ratio of $11,241,861/2^{24}=0.67006713$. Hence, the W0 value is the binary value that corresponds to the sampling frequency ratio that is closest to, but less than, Fin/Fout, and the W1 value is the binary value that corresponds to the sampling frequency ratio that is closest to, but greater than, Fin/Fout.

Figure 4:
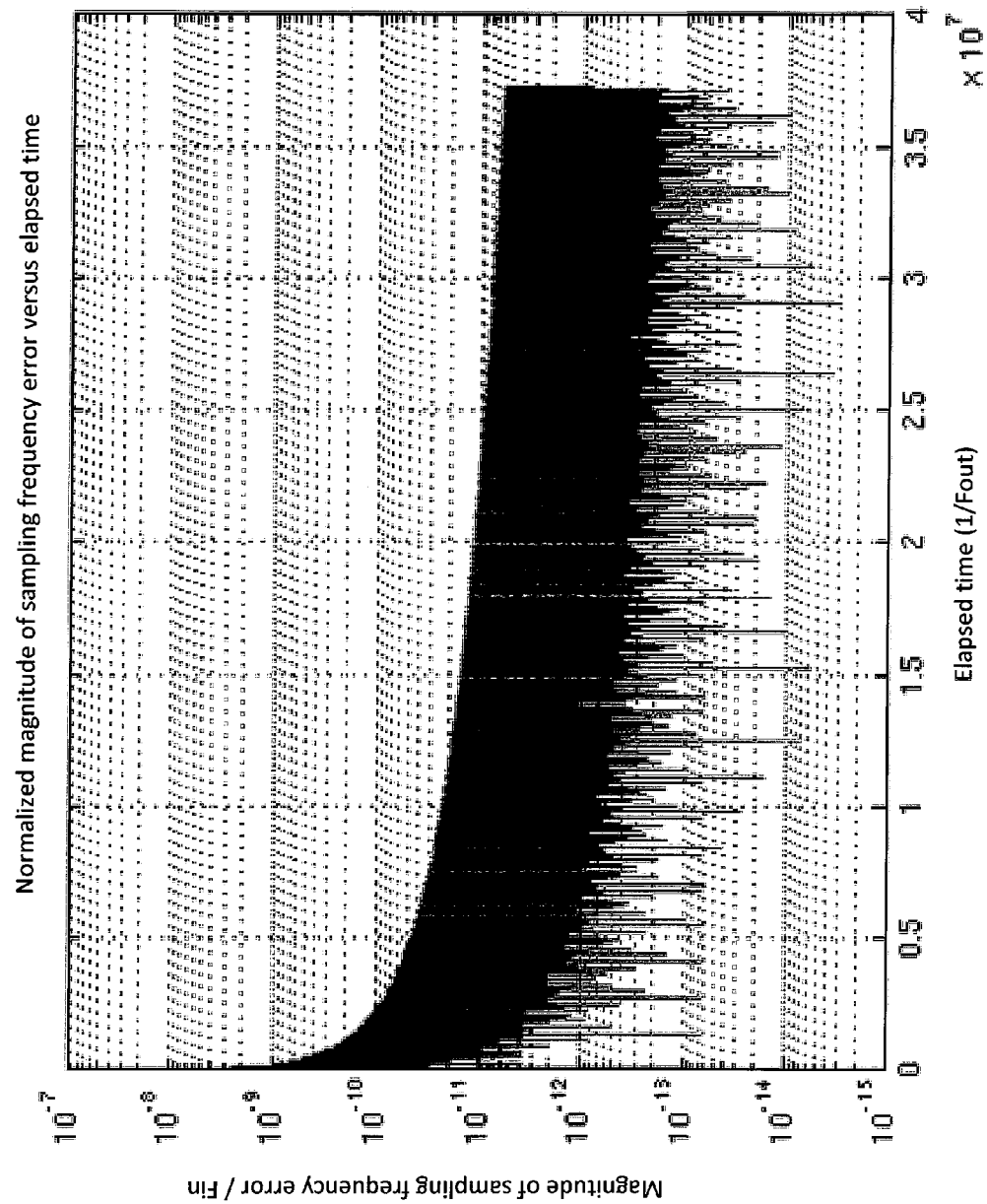
FIG. 4 is a chart showing the magnitude of sampling frequency error as a function of elapsed time using the rate control technique disclosed herein in accordance with an embodiment of the invention.

FIG. 4 is a chart showing the magnitude of sampling frequency error (normalized by a factor of 1/Fin) as a function of elapsed time (in units of 1/Fout) for the simulation using the rate control technique disclosed herein in accordance with an embodiment of the invention. The sampling frequency error is from the point of view of the receiver. The simulation used was executed for an elapsed time equivalent to more than 35 million output samples. As shown, the magnitude of the sampling frequency error is converging to less than $10^{-11}$ when normalized by the input sampling frequency Fin.

Figure 5:
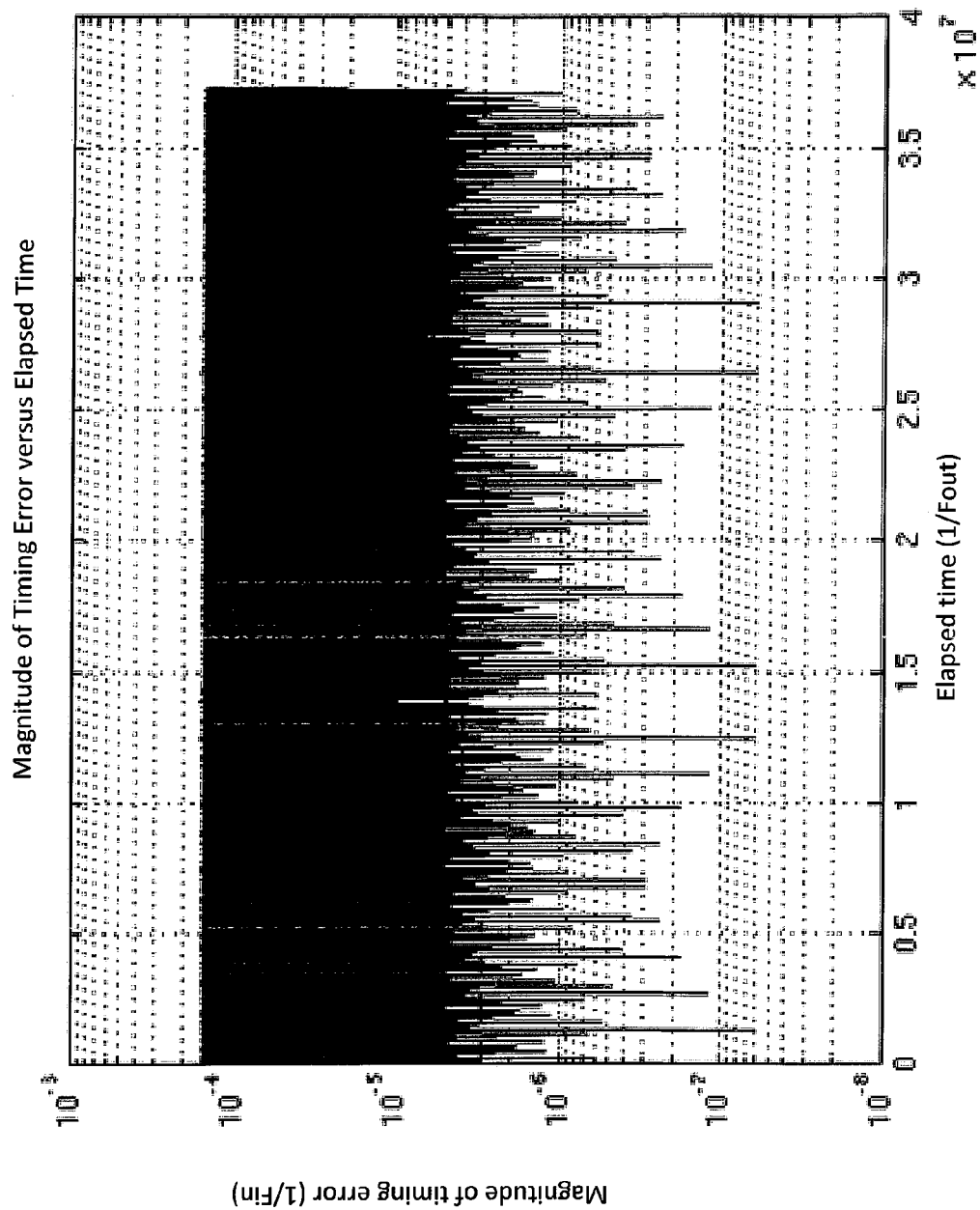
FIG. 5 is a chart showing the magnitude of peak-to-peak timing error as a function of elapsed time using the rate control technique disclosed herein in accordance with an embodiment of the invention.

FIG. 5 is a chart showing the magnitude of the peak-to-peak timing error (in units of 1/Fin) as a function of elapsed time (in units of 1/Fout) for the simulation using the rate control technique disclosed herein in accordance with an embodiment of the invention. The simulation used was executed for an elapsed time equivalent to more than 35 million output samples. As shown, the peak-to-peak sampling timing error is bounded at about $10^{-4}$ of the input sampling interval.

Given the simulation results of FIGS. 4 and 5, it may be concluded that the rate control approach disclosed herein does not introduce a substantial amount of jitter. Hence, no buffering appears needed to compensate for any introduced jitter.

Figure 6:
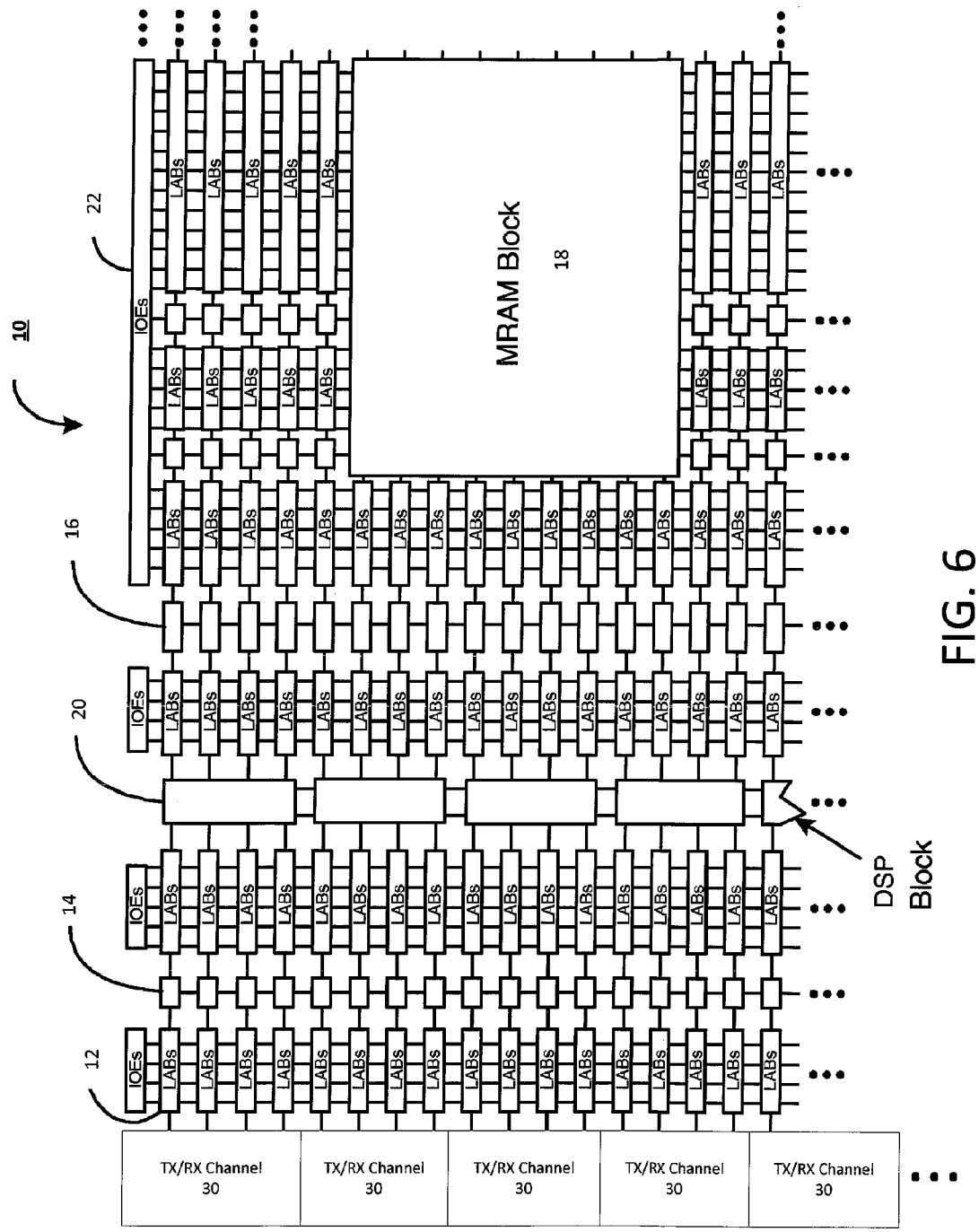
FIG. 6 is a simplified partial block diagram of an exemplary field programmable gate array (FPGA) that may be configured to implement an embodiment of the present invention.

FIG. 6 is a simplified partial block diagram of an exemplary field programmable gate array (FPGA) 10 that may be configured to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers.

FPGA 10 may further include digital signal processing (DSP) blocks 20 that can implement, for example, multipliers with add or subtract features. Input/output elements (IOEs) 22 located, in this example, around the periphery of the chip support numerous single-ended and differential input/output standards. Each IOE 22 is coupled to an external terminal (i.e., a pin) of FPGA 10.

A transceiver (TX/RX) channel array may be arranged as shown, for example, with each TX/RX channel circuit 30 being coupled to several LABs. Each TX/RX channel circuit 30 may include, among other circuitry, rate control circuitry for a fractional sample rate converter as disclosed herein.

It is to be understood that FPGA 10 is described herein for illustrative purposes only and that the present invention can be implemented in many different types of PLDs, FPGAs, and ASICs.

Figure 7:
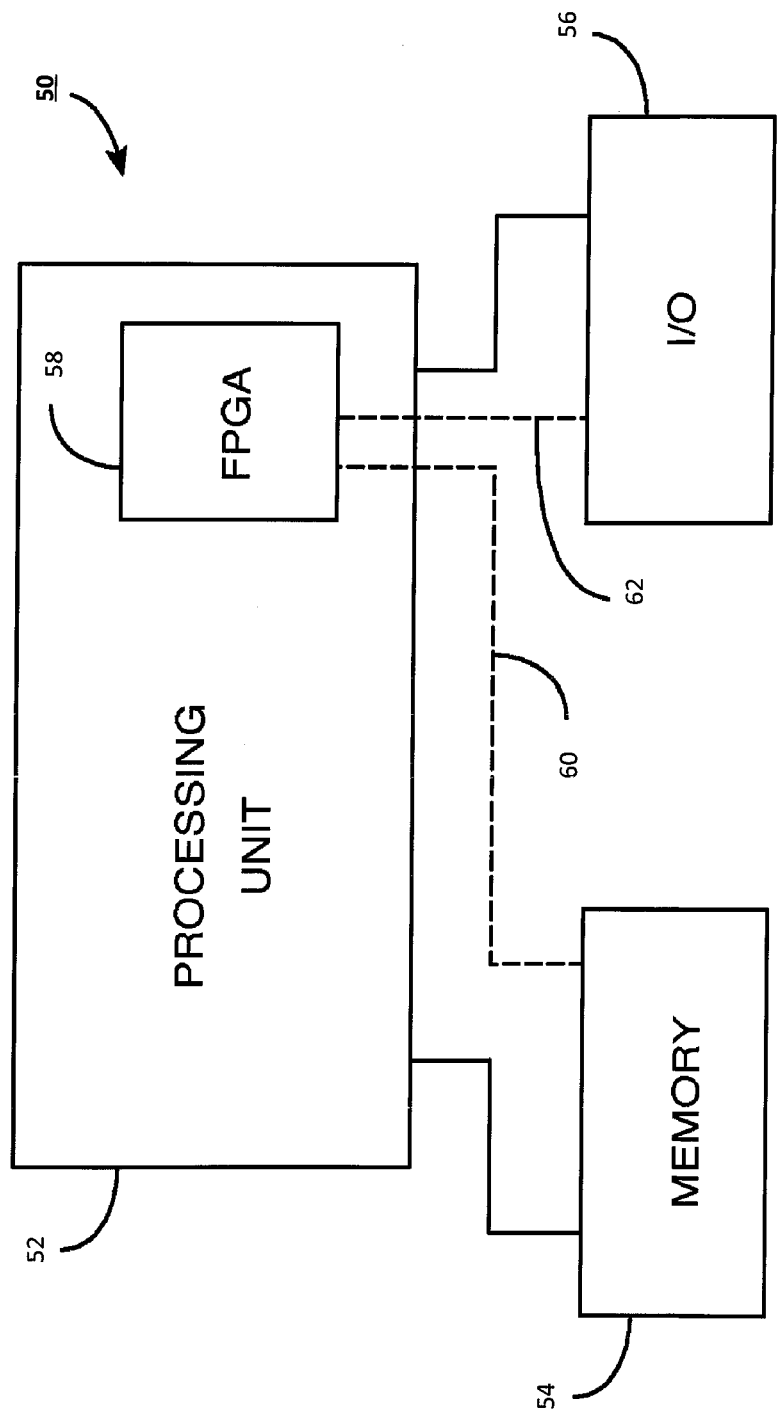
FIG. 7 shows a block diagram of an exemplary digital system that may employ apparatus and methods disclosed herein.

FIG. 7 shows a block diagram of an exemplary digital system 50 that may employ techniques disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An apparatus for sample rate conversion, the apparatus comprising:
    baseband modulator and filter circuitry for receiving a data bitstream and using a sample request signal to generate an input signal at an input sampling frequency;
    a sample rate converter for receiving the input signal and using an interpolation interval to convert the input signal to an output signal at an output sampling frequency, where the input sampling frequency and the output sampling frequency are different;
    a comparator for selecting a frequency control word from multiple frequency control words; and
    a rate controller for using the frequency control word in generating the interpolation interval,
    wherein the comparator compares the interpolation interval against a second number when an enable signal indicates that a counter is at a first number modulo N.

2. The apparatus of claim 1, wherein the sample rate converter comprises a fractional sample rate converter, and wherein a plurality of M samples of the input signal are received, and a plurality of N samples of the output signal are output in a same time interval.

3. The apparatus of claim 2, wherein the rate controller comprises:
    the counter for receiving a clock signal having a clock frequency which corresponds to the output sampling frequency; and
    circuitry for generating the enable signal that indicates when the counter is at the first number modulo N.

4. An apparatus for sample rate conversion, the apparatus comprising:
    baseband modulator and filter circuitry for receiving a data bitstream and using a sample request signal to generate an input signal at an input sampling frequency;
    a sample rate converter for receiving the input signal and using an interpolation interval to convert the input signal to an output signal at an output sampling frequency, where the input sampling frequency and the output sampling frequency are different, wherein the sample rate converter comprises a fractional sample rate converter, and wherein a plurality of M samples of the input signal are received, and a plurality of N samples of the output signal are output in a same time interval;
    a comparator for selecting a frequency control word from multiple frequency control words; and
    a rate controller for using the frequency control word in generating the interpolation interval;
    a counter for receiving a clock signal having a clock frequency which corresponds to the output sampling frequency; and
    circuitry for generating an enable signal that indicates when the counter is at a first number modulo N,
    wherein the comparator compares the interpolation interval against a second number when the enable signal indicates that the counter is at the first number modulo N.

5. The apparatus of claim 4, wherein the comparator is further arranged to output a first value for the control signal if the interpolation interval is less than the second number and a second value for the control signal if the interpolation interval is greater than the second number.

6. The apparatus of claim 5, wherein the first and second numbers are zero, the interpolation interval is represented by a multiple-bit binary number, and a most significant bit of the interpolation interval indicates a sign of the interpolation interval.

7. The apparatus of claim 5, wherein the rate controller further comprises:
    a selector arranged to receive the control signal and select a first frequency control word when the control signal is the first value and a second frequency control word when the control signal is the second value.

8. The apparatus of claim 7, wherein the first frequency control word represents a faster rate for the output sampling frequency than the second frequency control word.

9. The apparatus of claim 7, wherein the first frequency control word is a K-bit word among possible K-bit words which has a corresponding sampling frequency ratio that is closest to, but less than, a ratio of the input sampling frequency over the output sampling frequency, and wherein the second frequency control word is one greater than the first frequency control word.

10. The apparatus of claim 7, wherein the rate controller further comprises a numerically-controlled oscillator which is arranged to receive a frequency control word selected by the selector and generate the interpolation interval.

11. A method of sample rate conversion, the method comprising:
    selecting a frequency control word from multiple frequency control words using a control signal;
    generating an interpolation interval using the frequency control word;
    converting an input signal having an input sampling rate to an output signal having an output sampling rate using the interpolation interval;
    inputting the interpolation interval to a comparator that generates the control signal; and
    comparing the interpolation interval against a second number to generate the control signal when an enable signal indicates that a counter is at a first number modulo N.

12. The method of claim 11, wherein a first frequency control word is selected when the control signal is a first value, and a second frequency control word is selected when the control signal is a second value.

13. The method of claim 12, wherein the first frequency control word is a K-bit word among possible K-bit words which has a corresponding sampling frequency ratio that is closest to, but less than, a ratio of the input sampling frequency over the output sampling frequency, and wherein the second frequency control word is one greater than the first frequency control word.

14. A method of sample rate conversion, the method comprising:
    selecting a frequency control word from multiple frequency control words using a control signal;
    generating an interpolation interval using the frequency control word;

converting an input signal having an input sampling rate to an output signal having an output sampling rate using the interpolation interval; and inputting the interpolation interval to a comparator that generates the control signal, wherein M samples of the input signal are received and N samples of the output signal are output in a same time interval, the method further comprising:

receiving a clock signal having a clock frequency by a counter, wherein the clock frequency corresponds to the output sampling rate;

providing an enable signal when the counter is at a first number modulo N; and comparing the interpolation interval against a second number to generate the control signal when the enable signal indicates that the counter is at the first number modulo N.

15. The method of claim 14, wherein a first value for the control signal is output if the interpolation interval is less than the second number, and a second value for the control signal is output if the interpolation interval is greater than the second number.

16. The method of claim 14, wherein the first and second numbers are zero.

17. The method of claim 16, wherein the interpolation interval is represented by a multiple-bit binary number, and a most significant bit of the interpolation interval indicates a sign of the interpolation interval.

18. A rate controller circuit comprising:

a counter for receiving a clock signal having a clock frequency that corresponds to an output sampling frequency and generating an enable signal depending on a state of the counter;

a comparator that outputs a first value for a control signal if the interpolation interval is less than a number and a second value for the control signal if the interpolation interval is greater than the number; and a selector for receiving the control signal and selecting a first frequency control word when the control signal is the first value and a second frequency control word when the control signal is the second value.

19. The rate controller circuit of claim 18, wherein the interpolation interval is represented by a multiple-bit binary number, and a most significant bit of the interpolation interval indicates a sign of the interpolation interval.

20. The rate controller circuit of claim 18, wherein the first frequency control word is a multiple-bit word with a corresponding sampling frequency ratio that is closest to, but less than, a ratio of an input sampling frequency over the output sampling frequency, and wherein the second frequency control word is one greater than the first frequency control word.

* * * * *